(12) United States Patent
Ishizuka et al.

(10) Patent No.: US 10,600,677 B2
(45) Date of Patent: Mar. 24, 2020

(54) METHOD FOR MANUFACTURING BONDED SOI WAFER

(71) Applicant: SHIN-ETSU HANDOTAI CO., LTD., Tokyo (JP)

(72) Inventors: Toru Ishizuka, Takasaki (JP); Setsuya Hama, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/331,079

(22) PCT Filed: Aug. 22, 2017

(86) PCT No.: PCT/JP2017/029848
§ 371 (c)(1),
(2) Date: Mar. 6, 2019

(87) PCT Pub. No.: WO2018/061523
PCT Pub. Date: Apr. 5, 2018

(65) Prior Publication Data
US 2019/0198386 A1    Jun. 27, 2019

(30) Foreign Application Priority Data
Sep. 27, 2016    (JP) .................. 2016-188216

(51) Int. Cl.
*H01L 21/762* (2006.01)
*H01L 27/12* (2006.01)
(Continued)

(52) U.S. Cl.
CPC ........ *H01L 21/76254* (2013.01); *H01L 21/02* (2013.01); *H01L 21/324* (2013.01); *H01L 27/12* (2013.01)

(58) Field of Classification Search
CPC .................................................. H01L 21/7624
See application file for complete search history.

(56) References Cited

U.S. PATENT DOCUMENTS 6,171,982 B1    1/2001  Sato
2004/0152283 A1*  8/2004  Tate .................. H01L 21/67092
                                                                        438/458
(Continued)

FOREIGN PATENT DOCUMENTS

JP    H11-251563 A    9/1999
JP    2010-040638 A   2/2010
(Continued)

OTHER PUBLICATIONS

Nov. 14, 2017 International Search Report issued in International Patent Application PCT/JP2017/029848.

*Primary Examiner* — Errol V Fernandes
(74) *Attorney, Agent, or Firm* — Oliff PLC

(57) ABSTRACT

A method for manufacturing a bonded SOI wafer including a step of performing a heat treatment to each bonded SOI wafer having an oxide film on a back surface thereof in an argon atmosphere to flatten a front surface of an SOI layer, wherein, at the time of performing the heat treatment in the argon atmosphere in a batch processing heat treatment furnace, a silicon wafer is arranged as a dummy wafer between the adjacent bonded SOI wafers housed in the batch processing heat treatment furnace to perform the heat treatment. Consequently, there is the method for manufacturing an SOI wafer which enables suppressing an increase in LPDs at the step of performing the heat treatment to a bonded SOI wafer having an oxide film on a back surface thereof in an argon atmosphere in a batch processing heat treatment furnace to flatten a front surface of an SOI layer.

4 Claims, 1 Drawing Sheet

(51) Int. Cl.
*H01L 21/02* (2006.01)
*H01L 21/324* (2006.01)

(56) References Cited

U.S. PATENT DOCUMENTS

| | | | | |
|---|---|---|---|---|
| 2005/0227462 A1* | 10/2005 | Murakami | ........ | H01L 21/76243 438/517 |
| 2006/0024915 A1* | 2/2006 | Kobayashi | ........ | H01L 21/02008 438/455 |
| 2010/0112824 A1* | 5/2010 | Yokokawa | ........ | H01L 21/02238 438/770 |
| 2012/0244679 A1 | 9/2012 | Oka et al. | | |
| 2013/0023108 A1* | 1/2013 | Hanaoka | ........... | H01L 21/02238 438/458 |
| 2015/0017783 A1* | 1/2015 | Kobayashi | ........ | H01L 21/76254 438/458 |

FOREIGN PATENT DOCUMENTS

| | | |
|---|---|---|
| JP | 2011-146438 A | 7/2011 |
| JP | 2012-129347 A | 7/2012 |
| JP | 2016-201454 A | 12/2016 |

\* cited by examiner

[FIG. 1]
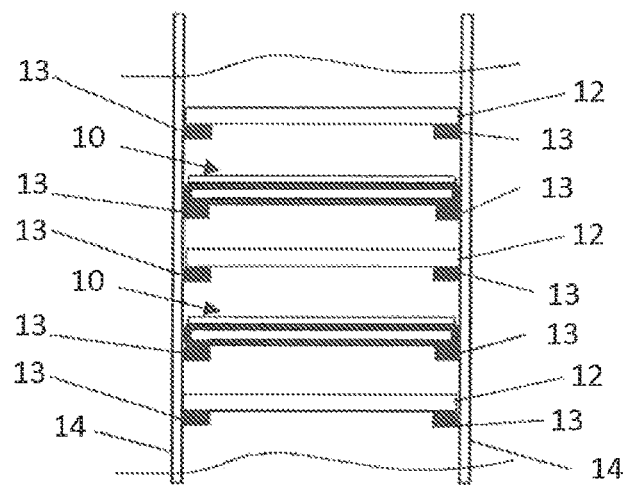
[FIG. 2]
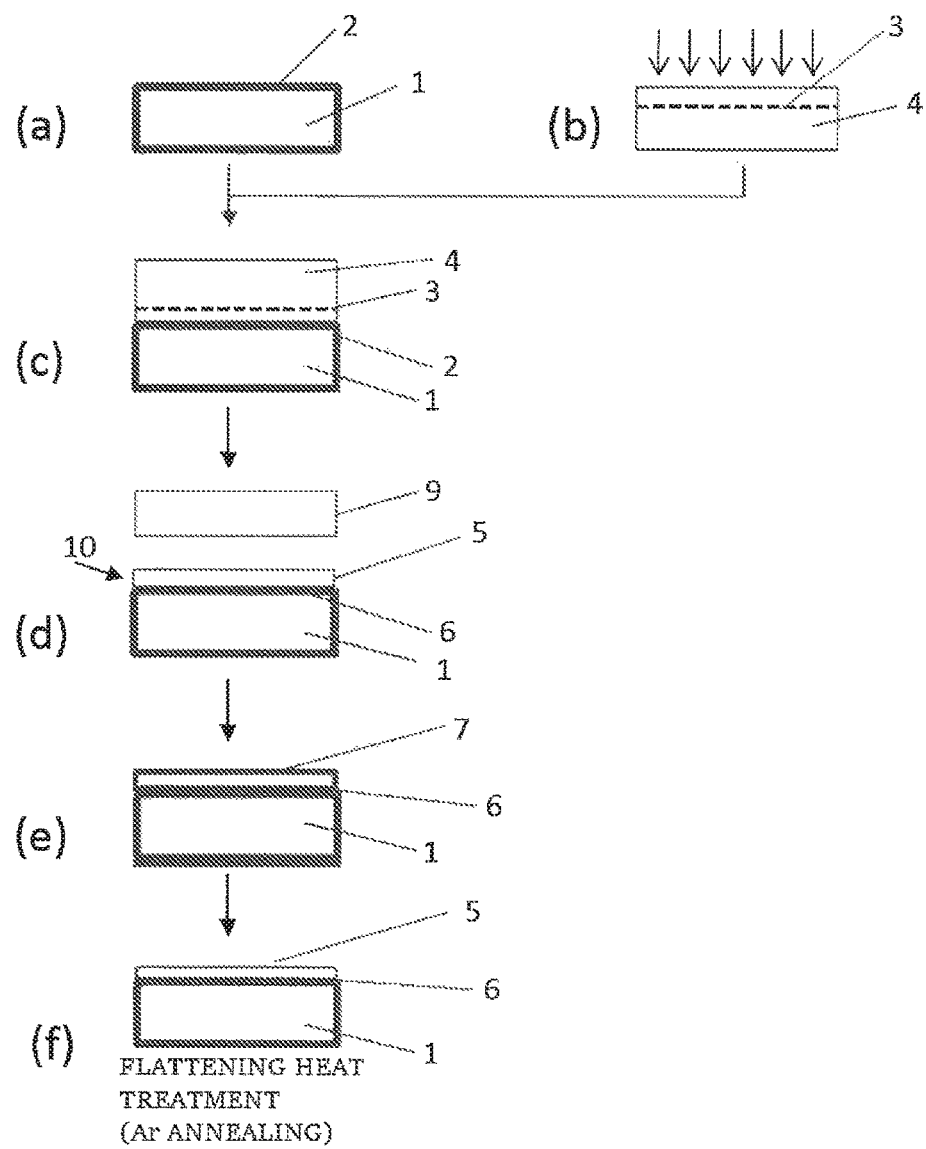
(f) FLATTENING HEAT TREATMENT (Ar ANNEALING)

METHOD FOR MANUFACTURING BONDED SOI WAFER

TECHNICAL FIELD

The present invention relates to a method for manufacturing a bonded SOI wafer.

BACKGROUND ART

As one of semiconductor device wafers, there is an SOI (Silicon On Insulator) wafer having a silicon layer (which may be referred to as an SOI layer hereinafter) formed on a buried oxide film which is an insulator film. This SOI wafer has characteristics such as a small parasitic capacitance or high radiation hardness ability since the SOI layer of a substrate surface layer portion which becomes a device fabrication region is electrically separated from the inside of the substrate by the buried insulator layer (a buried oxide film layer (a BOX layer)). Thus, effects such as a high-speed low-consumption-power operation or soft error prevention are expected, and this wafer is regarded as a viable high-performance semiconductor device substrate.

The SOI wafer having a configuration including a base wafer, a BOX layer, and an SOI layer is generally often manufactured by a bonding method. This bonding method is a method of forming a silicon oxide film on, e.g., a surface of at least one of two silicon single crystal wafers, then pressing the two wafers against each other through the formed oxide film, performing a bonding heat treatment to enhance bonding strength, thereafter reducing a thickness of the one wafer (a wafer that forms the SOI layer (which will be referred to as a bond wafer hereinafter)) by mirror polishing or a so-called ion implantation delamination method to manufacture the SOI wafer.

In case of manufacturing the SOI wafer by such a bonding method, for the purpose of keeping a bonding interface away from the SOI layer on which a device is fabricated, it is often the case that the oxide film is formed on the bond wafer side.

On the other hand, speed improvement and capacity enlargement have been recently advancing in various communication devices. With this, performance improvement in radio frequency devices (RF devices) has been also demanded. Further, silicon photonics (Si photonics) to fabricate not only an electronic integrated circuit but also an optical integrated circuit on a silicon substrate has been also demanded. Some of bonded SOI wafers coping with these use applications are required to have a thick BOX oxide film. When the bonded SOI wafer includes the thick BOX oxide film, in terms of an upper limit of ion implantation energy, a technique to grow the thick oxide film on a base wafer side and perform bonding is used in some cases. Furthermore, when the thick oxide film is grown on the base wafer, a bonded SOI wafer manufacturing process is performed in a state where the thick oxide film is also provided on a back surface side which is opposite to a bonding surface of the base wafer.

To manufacture the bonded SOI wafer by the ion implantation delamination method, a step of improving flatness of an SOI layer surface after delamination is required. As this flattening step, there are a flattening step which is performed by using CMP (Chemical Mechanical Polishing) and a flattening step based on high-temperature annealing in a hydrogen gas or inert gas atmosphere (which may be referred to as a flattening heat treatment hereinafter). Usually, one of these steps is performed to the bonded SOI wafer after delamination.

Roughness of the SOI layer surface after the flattening step using CMP is equal to that of a mirror-polished wafer, but radial film thickness uniformity of the SOI layer tends to degrade. On the other hand, the flattening step based on high-temperature annealing results in roughness slightly higher than that of the mirror-polished wafer, but the film thickness uniformity of the SOI layer is good. In large-diameter wafers each having a diameter of 300 mm or more in particular, degradation of the film thickness uniformity at the flattening step using CMP is considerable. As compared with this, the flattening based on the high-temperature annealing does not have such a tendency.

As an example of a heat treatment to flatten the SOI layer surface by the high-temperature annealing, there is annealing in an argon atmosphere containing an argon gas which is an inert gas (which may be referred to as an Ar annealing hereinafter) (Patent Literature 1).

Although FIG. 1(e) and a paragraph [0047] in Patent Literature 1 have a description that an SOI wafer having an oxide film on a back surface thereof is subjected to a heat treatment in an inert gas atmosphere as the flattening heat treatment, it is preferable to perform the heat treatment at 1200° C. or more in case of an argon gas atmosphere (see a paragraph [0048] in Patent Literature 1).

CITATION LIST

Patent Literature

Patent Literature 1: Japanese Unexamined Patent Application Publication No. 2012-129347

SUMMARY OF INVENTION

Technical Problem

The present inventors have discovered that, when an SOI wafer having an oxide film on a back surface is subjected to a high-temperature Ar annealing treatment in a batch processing treatment furnace, LPDs (Light Point Defects) tend to increase mainly on a surface of an SOI layer placed immediately below wafer support portions as compared with those before the Ar annealing.

When the observed LPDs are analyzed by EDX (Energy Dispersive X-ray Spectroscopy) of an SEM (Scanning Electron Microscope), oxygen and silicon are detected. However, an increase in LPDs is not always observed in a wafer put at the top in the hatch furnace.

On the other hand, in case of an SOI wafer having no oxide film on a back surface thereof, an increase in LPDs is not observed before and after the annealing. This suggests that the increase in LPDs depends on a back-side oxide film. At the time of performing the high-temperature Ar annealing to the SOI wafer having the oxide film on the back surface thereof, the increase in LPDs must be suppressed.

In view of the above-described problem, it is an object of the present invention to provide a method for manufacturing an SOI wafer which enables suppressing an increase in LPDs at a step of performing a heat treatment to each bonded SOI wafer having an oxide film on a back surface thereof in an argon atmosphere in a batch processing heat treatment furnace to flatten a surface of an SOI layer.

Solution to Problem

To achieve the object, the present invention provides a method for manufacturing a bonded SOI wafer including a step of performing a heat treatment to each bonded SOI wafer having an oxide film on a back surface thereof in an argon atmosphere to flatten a front surface of an SOI layer wherein, at the time of performing the heat treatment in the argon atmosphere in a batch processing heat treatment furnace, a silicon wafer is arranged as a dummy wafer between the adjacent bonded SOI wafers housed in the batch processing heat treatment furnace to perform the heat treatment.

As described above, when the silicon wafer is arranged between the bonded SOI wafers adjacent to each other, an increase in LPDs on the surface of each bonded SOI wafer having the oxide film on the back surface thereof can be suppressed, and the bonded SOI wafers having less LPDs can be stably manufactured.

At this time, it is preferable for the silicon wafer used as the dummy wafer to be a mirror-polished wafer which has not been used as the dummy wafer or a mirror-polished wafer which has been used as the dummy wafer and then cleaned.

Such a dummy wafer can be easily prepared, an effect to suppress the increase in LPDs is high, and hence the bonded SOI wafers having less LPDs can be inexpensively manufactured.

Moreover, it is preferable to set a temperature of the heat treatment in the argon atmosphere to 1150° C. or more.

Setting the temperature of the heat treatment to 1150° C. or more enables further enhancing a surface roughness improving effect for the SOI layers of the respective bonded SOI wafers.

Advantageous Effects of Invention

According to the present invention, at the step of performing a heat treatment to each bonded SOI wafer having an oxide film on a back surface thereof in an argon atmosphere in a batch processing heat treatment furnace to flatten a surface of an SOI layer, an increase in LPDs on the SOI layer surface can be suppressed, and a yield of the bonded SOI wafers having less LPDs can be improved. Thus, the bonded SOI wafers having less LPDs can be stably manufactured.

BRIEF DESCRIPTION OF DRAWINGS

FIG. 1 is a schematic view showing an example of arrangement of bonded SOI wafers and dummy wafers in a batch processing heat treatment furnace according to a method for manufacturing an SOI wafer of the present invention; and FIG. 2 is a process flowchart showing an embodiment of the method for manufacturing an SOI wafer of the present invention.

DESCRIPTION OF EMBODIMENTS

A detailed description will now be given below on an example of an embodiment of the present invention with reference to the drawings, but the present invention is not restricted thereto.

FIG. 2 is a process flowchart showing an embodiment of a method for manufacturing a bonded SOI wafer according to the present invention. The method for manufacturing a bonded SOI wafer according to the present invention will now be described hereinafter with reference to FIG. 2.

As a base wafer 1 of a bonded SOI wafer, a substrate having an oxide film 2 with a thickness of, e.g., 1 μm on front and back surfaces thereof is prepared (FIG. 2(a)) The thickness of the oxide film 2 formed here is not restricted in particular as long as it is such a thickness as the oxide film remains on the back surface of the SOI wafer at a flattening heat treatment step which is a later step (f). The oxide film 2 can be formed by, e.g., normal thermal oxidation. On the other hand, at least one type of ions, which is hydrogen ions or a rare gas, can be ion-implanted to a bond wafer 4 to form an ion-implanted layer 3 (FIG. 2(b)). This is performed to form the ion-implanted layer 3 into a delamination plane at a step indicated by (d) in FIG. 2. A depth of the ion-implanted layer 3 from a surface of the bond wafer 4 can be set in accordance with a desired thickness of an SOI layer by adjusting a type or energy of ions to be implanted.

Then, the base wafer 1 having the oxide film 2 formed thereon is bonded to the bond wafer 4 having the ion-implanted layer 3 formed therein through the oxide film 2 in such a manner that the surface of the bond wafer 4 in which the ion-implanted layer 3 has been formed becomes a bonding surface side as shown in FIG. 2(c) (a bonding step). Before this bonding step, to remove contamination such as particles or organic substances attached to the surface of the wafer, pre-bonding cleaning for the base wafer 1 and the bond wafer 4 may be carried out. As the pre-bonding cleaning, for example, RCA cleaning can be used.

When a delamination heat treatment is performed to the base wafer 1 and the bond wafer 4 which have been bonded at the bonding step in, e.g., a nitrogen atmosphere at a temperature of approximately 500° C., the bond wafer can be delaminated with the ion-implanted layer 3 used as the delamination plane (a delamination step). This delamination step enables fabricating a bonded SOI wafer 10 which is constituted of an SOI layer 5 after the delamination, a BOX layer 6 (the oxide film 2), and the base wafer 1 and has the oxide film 2 on the back surface thereof. At this time, a bond wafer 9 after the delamination is produced as a by-product, but this bond wafer 9 after the delamination can be reproduced as a new bond wafer 4.

To enhance bonding strength of a bonding interface of the SOI layer 5 and the base wafer 1 after the delamination, a bonding heat treatment in a high-temperature oxidizing atmosphere may be performed (a bonding heat treatment step). At this bonding heat treatment, as shown in FIG. 2(e), a front surface oxide film 7 is formed by the bonding heat treatment on the surface of the SOI layer 5 after the delamination. Then, the front surface oxide film 7 formed by the bonding heat treatment is removed by, e.g., a hydrofluoric acid. A sacrificial oxidizing treatment using this oxide film formation and the oxide film removal enables removing mechanical damage caused at the time of the delamination or implantation damage caused at the time of the ion implantation of hydrogen ions or the like.

Since the bonded SOI wafer 10 after the delamination has high surface roughness on the surface of the SOI layer 5 after the delamination, the surface roughness is improved by Ar annealing (FIG. 2(f), a flattening heat treatment step). Usually, as a heat treatment temperature at this time, 1100° C. or more can suffice, but it is preferable to set a temperature of the heat treatment in the argon atmosphere to 1150° C. or more in the method for manufacturing a bonded SOI wafer according to the present invention. When such a heat treatment temperature is set, migration on the surface of the SOI layer 5 sufficiently advances, and the surface roughness improving effect on the SOI layer 5 of the bonded SOI wafer can be further boosted. This heat treatment temperature is more preferably 1200° C. or more. When the heat treatment is performed at a higher temperature, the surface roughness can be further improved Additionally, an upper limit of this heat treatment temperature is not restricted in particular, it is, e.g., 1300° C. or less. Although a processing time of the Ar annealing is not restricted in particular, it can be set to three minutes to 10 hours, or more preferably approximately 30 minutes to two hours. This high-temperature Ar annealing processing causes the migration of silicon atoms on the surface of the SOI layer 5, and the surface of the SOI layer 5 is flattened. It is to be noted that the argon atmosphere in the present invention can be an Ar gas 100% atmosphere as well as a non-oxidizing atmosphere mainly containing an Ar gas.

At the time of this Ar annealing, when each bonded SOI wafer 10 having the oxide film on the hack surface thereof is put into the batch processing heat treatment furnace by a normal method, the oxide film 2 on the back surface of the bonded SOI wafer in an upper slot faces the upper surface of the SOI layer 5 subjected to the delamination. When the bonded SOI wafer 10 is arranged in this manner, it can be considered that an oxygen component discharged from the back surface of the bonded SOI wafer 10 reaches the front surface of the SOI layer 5 of the bonded SOI wafer 10 in a lower slot, which can be a cause of production of LPDs.

On the other hand, in the method for manufacturing a bonded SOI wafer according to the present invention, a silicon wafer 12 is arranged as a dummy wafer between the adjacent bonded SOI wafers 10 housed in the batch processing heat treatment furnace to perform a heat treatment in order to prevent occurrence of the LPDs described above. FIG. 1 shows an example of arrangement of the bonded SOI wafers 10 and the dummy wafers (the silicon wafers 12). As shown in FIG. 1, each bonded SOI wafer 10 having the oxide film on the back surface thereof is arranged on wafer support portions 13, which are formed on support poles 14 of a boat, every other slot, and each silicon wafer 12 is arranged as the dummy wafer in a slot between the bonded SOI wafers 10. As each silicon wafer 12, one which does not have the oxide film on the back surface and the front surface thereof is used (a natural oxide film may not be applied thereto). When such arrangement is adopted, the back surface of the silicon wafer 12 having no oxide film is placed immediately above the bonded SOI wafer 10 having the oxide film on the back surface thereof. Thus, the oxygen component discharged from the back surface of the upper bonded SOI wafer 10 having the oxide film on the back surface thereof is interrupted by the silicon wafer 12 and hardly reaches the front surface of the bonded SOI wafer in the lower slot.

Further, in the method for manufacturing a bonded SOI wafer according to the present invention, it is preferable to use a mirror-polished wafer which has not been used as the dummy wafer or a mirror-polished wafer which has been used and then cleaned as each silicon wafer 12 which is used as the dummy wafer.

There is a phenomenon that contamination is gradually deposited on each silicon wafer (the mirror-polished wafer) 12 arranged between the bonded SOI wafers 10 due to the oxygen component discharged from the surrounding bonded SOI wafers 10. When the heat treatment is repeated while leaving this contamination, the oxygen component is discharged from each mirror-polished wafer used as the dummy wafer in turn. Furthermore, this oxygen component reaches the surfaces of the bonded SOI wafers and becomes a factor which forms defects on the surfaces. Thus, it is preferable to replace each mirror-polished wafer 12 arranged between the bonded SOI wafers 10 with a mirror-polished wafer which has not been used as the dummy wafer and has a clean surface in accordance with each batch or after processing a predetermined number of batches, or reuse the clean mirror-polished wafer which has been used as the dummy wafer and then cleaned. Moreover, each mirror-polished wafer can be easily prepared as the dummy wafer and enables inexpensively manufacturing the bonded SOI wafers having less LPDs.

Additionally, as a technique to suppress an influence on the back surface side of each bonded SOI wafer 10 having the oxide film on the back surface thereof, a technique to simply expand each slot interval which is used at the time of loading the batch processing heat treatment to, e.g., an every-two-slot interval, an every-three-slot interval, or an every-four-slot interval can be considered. However, in this case, since nothing can interrupt the oxygen component discharged from the back surface side of the upper bonded SOI wafer 10, it can be considered that suppressing the component which reaches the surface of the lower bonded SOI wafer 10 due to diffusion is difficult. Further, when each slot interval is set to the every-two-slot interval or a wider interval, productivity of the batch processing heat treatment furnace is considerably impaired.

EXAMPLES

Example 1

As each of a bond wafer 4 and a base wafer 1, a silicon single crystal wafer having both surfaces polished, a diameter of 300 mm, a p conductivity type, a resistivity of 10 Ω·cm, and a crystal orientation of <100> was prepared. Then, an oxide film 2 of 1 µm was grown on the base wafer 1 at an oxidizing temperature of 950° C. At this time, the oxide film 2 of approximately 1 µm was also grown on a wafer back surface side.

This base wafer 1 was bonded to the bond wafer 4 having hydrogen ions implanted with an accelerating voltage of 50 keV and a dosage of $5.0\times10^{16}/cm^2$, a heat treatment was performed at; 500° C. for 20 minutes, and delamination was carried out at an ion-implanted layer 3 to fabricate a bonded SOI wafer 10.

An oxide film of 0.15 µm was formed at 900° C. on the bonded SOI wafer 10 after delamination, and then HF cleaning to remove this film was carried out (a sacrificial oxidizing treatment). Consequently, the bonded wafer 10 having no oxide film on the front surface thereof but having the oxide film of approximately 0.85 µm on the back surface thereof was obtained.

Then, a batch processing heat treatment furnace which is a vertical resistance heating type was used to carry out a flattening heat treatment based on inert gas atmosphere annealing (Ar 100%) at 1200° C. for one hour. At this time, 100 bonded SOI wafers 10 to be flattened were arranged on wafer support portions 13 every other slot, and each mirror-polished wafer 12 which had not been used as a dummy wafer and is made of a silicon single crystal was arranged between the bonded SOI wafers 10. After this flattening heat treatment, a sacrificial oxidizing treatment (oxidization at 950° C. and removal of the formed oxide films) was performed, and a thickness of each SOI layer was adjusted to 150 nm. As an evaluation of defects on the surface of each bonded SOI wafer 10, LPDs each having a diameter of 0.10 µm or more were measured, and then 84% of the bonded wafers were accepted to an acceptance/rejection standard which is 100 LPDs/wafer or less.

Example 2

Bonded SOI wafers 10 were fabricated in 10 continuous batches under the same conditions as those of Example 1.

However, in this 10-batch processing, mirror-polished wafers 12 used in the first batch were not cleaned or replaced, and then they were used for a flattening heat treatment in the subsequent nine continuous batches to fabricate the bonded SOI wafers 10. LPD measurement was performed to the bonded SOI wafers 10 fabricated in the 10th batch under the same conditions as those of Example 1, and then 75% of the bonded SOI wafers were accepted.

Example 3

Mirror-polished wafers 12 used in the continuous 10-batch processing in Example 2 were cleaned (SC1 cleaning and SC2 cleaning) The cleaned mirror-polished wafers 12 were used to perform the first processing to the flattening heat treatment under the same manufacturing conditions as those of Example 1. Further, the LPD measurement was performed under the same conditions as those of Example 1. Consequently, 82% of the bonded SOI wafers were accepted.

Comparative Example 1

The first processing to a flattening heat treatment were carried out under the same manufacturing conditions as those of Example 1 except that 100 bonded SOI wafers 10 to be fattened were placed on wafer support portions 13 in a batch processing heat treatment furnace without gap at the time of the flattening heat treatment. Further, the LPD measurement was performed under the same conditions as those of Example 1, Consequently, only 2% of the bonded SOI wafers accepted.

Comparative Example 2

The first processing to a flattening heat treatment were carried out under the same manufacturing conditions as those of Example 1 except that 100 bonded SOI wafers 10 to be flattened were arranged in a boat of a batch processing heat treatment furnace every other slot and each mirror-polished wafer 12 was not arranged between these bonded SOI wafers 10 at the time of the flattening heat treatment. Furthermore, the LPD measurement was performed under the same conditions as those of Example 1, and then only 32% of the bonded SOI wafers were accepted.

Comparative Example 3

The first processing to a flattening heat treatment were carried out under the same manufacturing conditions as those of Example 1 except that 50 bonded SOI wafers 10 to be flattened were arranged in a boat of a batch processing heat treatment furnace every two slots at expanded wafer intervals and each mirror-polished wafer 12 was not arranged between the bonded SOI wafers 10 at the time of the flattening heat treatment. Moreover, the LPD measurement was performed under the same conditions as those of Example 1, and then only 60% of the bonded SOI wafers were accepted. In Comparative Example 3, an acceptance rate was higher than those of Comparative Examples 1 and 2 but far lower than those of Examples 1 to 3, and the productivity was reduced as compared with Examples since the number of the bonded SOI wafers 10 to be placed had to be reduced.

As described above, in the method for manufacturing a bonded SOI wafer according to the present invention, a yield of the bonded SOI wafers with less LPDs was successfully improved. Moreover, the bonded SOI wafers with less LPDs were stably manufactured.

It is to be noted that the present invention is not restricted to the foregoing embodiments. The foregoing embodiments are illustrative examples, and any example which has substantially the same structure and exerts the same functions and effects as the technical concept described in claims of the present invention is included in the technical scope of the present invention.

The invention claimed is:

1. A method for manufacturing a bonded SOI wafer comprising a step of performing a heat treatment to each bonded SOI wafer having an oxide film on a back surface thereof in an argon atmosphere to flatten a front surface of an SOI layer,
wherein, at the time of performing the heat treatment in the argon atmosphere in a batch processing heat treatment furnace, a silicon wafer is arranged as a dummy wafer between the adjacent bonded SOI wafers housed in the batch processing heat treatment furnace to perform the heat treatment.

2. The method for manufacturing a bonded SOI wafer according to claim 1,
wherein the silicon wafer used as the dummy wafer is a mirror-polished wafer which has not been used as the dummy wafer or a mirror-polished wafer which has been used as the dummy wafer and then cleaned.

3. The method for manufacturing a bonded SOI wafer according to claim 1,
wherein a temperature of the heat treatment in the argon atmosphere is set to 1150° C. or more.

4. The method for manufacturing a bonded SOI wafer according to claim 2,
wherein a temperature of the heat treatment in the argon atmosphere is set to 1150° C. or more.

* * * * *